(12) United States Patent
Kolleth et al.

(10) Patent No.: US 8,604,599 B2
(45) Date of Patent: Dec. 10, 2013

(54) SEMICONDUCTOR HOUSING AND METHOD FOR THE PRODUCTION OF A SEMICONDUCTOR HOUSING

(75) Inventors: Tobias Kolleth, Freiburg (DE); Pascal Stumpf, Horbourg-Wihr (FR); Christian Joos, Ehrenkirchen (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 13/416,591

(22) Filed: Mar. 9, 2012

(65) Prior Publication Data

US 2012/0228756 A1 Sep. 13, 2012

Related U.S. Application Data

(60) Provisional application No. 61/450,979, filed on Mar. 9, 2011.

(30) Foreign Application Priority Data

Mar. 9, 2011 (DE) .......................... 10 2011 013 468

(51) Int. Cl.
*H01L 23/04* (2006.01)
*H01L 21/78* (2006.01)

(52) U.S. Cl.
USPC ............... 257/680; 257/81; 257/99; 257/100; 257/433; 257/434; 257/E23.117; 257/E23.128; 257/E23.129; 257/E23.193; 257/E23.194

(58) Field of Classification Search
USPC ..................... 257/81, 99, 100, 433, 434, 680, 257/E23.128, E23.129, E23.193, E23.194, 257/E31.117
See application file for complete search history.

(56) References Cited

U.S. PATENT DOCUMENTS

| 4,894,707 A | 1/1990 | Yamawaki et al. |
| 5,534,725 A * | 7/1996 | Hur .............................. 257/434 |
| 6,401,545 B1 | 6/2002 | Monk et al. |

(Continued)

FOREIGN PATENT DOCUMENTS

| DE | 10 2009 039068 A1 | 2/2009 |
| EP | 0 202 701 A1 | 11/1986 |

(Continued)

OTHER PUBLICATIONS

Lung-Tai Chen et al., "Fabrication and Performance of MEMS-Based Pressure Sensor Packages Using Patterned Ultra-Thic Photoresists"; Sensors 2009, 9, pp. 6200-6218.

*Primary Examiner* — Peniel M Gumedzoe
(74) *Attorney, Agent, or Firm* — Muncy, Geissler, Olds & Lowe, PLLC

(57) ABSTRACT

A semiconductor housing is provided that includes a metal support and a semiconductor body, a bottom side thereof being connected to the metal support. The semiconductor body has metal surfaces that are connected to pins by bond wires and a plastic compound, which completely surrounds the bond wires and partially surrounds the semiconductor body. The plastic compound has an opening on the top side of the semiconductor body, and a barrier is formed on the top side of the semiconductor body. The barrier has a top area and a base area spaced from the edges of the semiconductor body and an internal clearance of the barrier determines a size of the opening. Whereby, a portion of the plastic compound has a height greater than the barrier, and a fixing layer is formed between the base area of the barrier and the top side of the semiconductor body.

20 Claims, 3 Drawing Sheets

(56) References Cited

U.S. PATENT DOCUMENTS

| | | | |
|---|---|---|---|
| 6,492,699 B1 * | 12/2002 | Glenn et al. | 257/433 |
| 7,906,859 B2 | 3/2011 | Yoshioka et al. | |
| 2009/0053850 A1 * | 2/2009 | Nishida et al. | 438/64 |
| 2009/0243015 A1 | 10/2009 | Yoneda et al. | |

FOREIGN PATENT DOCUMENTS

| | | |
|---|---|---|
| EP | 2 154 713 A1 | 2/2010 |
| WO | WO 2006/101274 A1 | 9/2006 |
| WO | WO 2006/114005 A1 | 11/2006 |

* cited by examiner

SEMICONDUCTOR HOUSING AND METHOD FOR THE PRODUCTION OF A SEMICONDUCTOR HOUSING

This nonprovisional application claims priority to German Patent Application No. DE 10 2011 013 468.9, which was filed in Germany on Mar. 9, 2011, and to U.S. Provisional Application No. 61/450,979, which was filed on Mar. 9, 2011, and which are both herein incorporated by reference.

BACKGROUND OF THE INVENTION

1. Field of the Invention

The invention relates to a semiconductor housing and a method for the production of a semiconductor housing.

2. Description of the Background Art

A semiconductor housing, which is also called a chip housing, and a method for the production of the same are known from the "Fabrication and Performance of MEMS-Based Pressure Sensor Packages Using Patterned Ultra-Thick Photoresists", Sensors 2009, 9, 6200-6218. Housings of this kind are used, among others, for accommodating sensors. To this end, the housings have an opening on their top side. The sensors on the top side of the semiconductor body, otherwise encapsulated with a casting compound, can communicate with the surroundings by means of the opening. In the case of gas sensors, for example, gas molecules can diffuse through the opening to the sensor. In the production of housings of this kind, it is important during the molding process, on the one hand, to ensure that no molding compound penetrates into the area of the opening, and, on the other, to cover particularly the bond wires and the non-sensor area, which generally comprises a circuit part, with molding compound in order to protect these areas reliably from environmental effects. In the aforementioned state of the art, a closed barrier is built on the surface of the semiconductor body for this purpose, preferably at the end of the semiconductor production process by means of a lithography process. The barrier is then pressed against the inner side of the molding tool, in which a so-called "transfer molding process" is carried out, and the molding compound is introduced into the semiconductor body up to the height of the barrier. The barrier must be made very high in order to encapsulate the bond wires and other structures on the top side with a plastic compound. Furthermore, the variation in height from barrier to barrier may only be very small in order not to damage the barrier because of the high contact pressure during pressing of the semiconductor body against the inner side of the transfer chamber.

Another option for producing openings in a semiconductor housing is disclosed in EP 0 202 701 B1. In this case, the openings are formed without the formation of barriers by means of a conventional plunger-guiding injection molding tool. The plunger in this case must be encased with a relatively cost-intensive film. Next, the plunger is lowered to the surface of the semiconductor body. The elastic film is intended to prevent, among others, damage to the semiconductor surface.

Another method for producing a semiconductor housing with an opening is disclosed in WO 2006/114005 A1. In this case, before the production of the plastic housing, a buffer structure overlapping a sensor surface is formed which is removed toward the end of the production process preferably by a wet chemical means.

SUMMARY OF THE INVENTION

It is therefore an object of the invention to provide a semiconductor housing and a method for the production of a semiconductor housing. According to an embodiment of the invention, a semiconductor housing is disclosed, having a metal support, a semiconductor body arranged on the metal support with a top side and a bottom side, whereby the bottom side is connected force-fittingly to the metal support, and the semiconductor body has a plurality of metal surfaces on the top side, and the metal surfaces are connected to pins by means of bond wires for the electrical contacting of the semiconductor body, and a plastic compound, whereby the plastic compound completely surrounds the bond wires and partially surrounds the semiconductor body on the top side thereof and the pins, and whereby the plastic compound has an opening on the top side of the semiconductor body, and a frame-shaped or ring-shaped barrier is formed on the top side of the semiconductor body, whereby the barrier has a top area and a base area spaced from the edges of the semiconductor body and the internal clearance of the barrier determines the size of the opening on the top side of the semiconductor body, and whereby in the direction of the normal vector of the area on the top side of the semiconductor body the plastic compound in the area outside the opening substantially has a height greater than the barrier, and a fixing layer is formed between the base area of the barrier and the top side of the semiconductor body, and the barrier is spaced from a sensor surface formed within the opening.

According to a further embodiment of the invention, a method for the production of a semiconductor housing with an opening is disclosed, whereby in a process step a wafer is diced into semiconductor bodies, and the semiconductor body, which has a top side and a bottom side, is attached with its bottom side to a metal support, and the semiconductor body is electrically connected to pins in a bonding process via bond wires, and in a subsequent process step a frame-shaped barrier is fixed on the surface of the semiconductor body, and in a subsequent molding process a plunger, which has a surface, and the surface of the plunger are pressed at least partially against the top area of the barrier, and then a plastic compound, also called a casting compound, is injected and cured, so that the bond wires are completely enclosed and the semiconductor body on the surface thereof and preferably also its side surfaces and the pins are partially enclosed by the plastic compound.

An advantage of the device of the invention and of the method is that openings in a semiconductor housing can be produced reliably and cost-effectively. To this end, after dicing of the wafer into individual semiconductor bodies and the arrangement of an individual semiconductor body, also called a die, the semiconductor body with the bottom side is connected force-fittingly to the top side of a metal support, the so-called lead frame. In the subsequent bonding process, bond wires are drawn from the metal surfaces to the pins and attached by means of a standard bonding method, to form an electrical connection between the metal surfaces and the pins. Next, the frame-shaped or ring-shaped barrier, which has a fixing layer on its bottom side, is fixed with the bottom side to the surface of each semiconductor body, in order to form an opening in the following process step. The placement of a finished frame on the semiconductor body makes it possible to avoid a costly lithography process to form a barrier. Another advantage is that, on the one hand, virtually any height of the barrier can be set by means of the frame and, on the other, tolerances, particularly height tolerances, of the barrier can be reduced. Because the barrier is spaced from an internal sensor surface, the production process can be developed particularly for semiconductor bodies which particularly have a sensor surface without there being the danger of damage to the sensor surface. It is preferred to arrange the bottom side of the barrier completely on the fixing layer without the formation of a step and also to form the fixing layer completely, i.e., without the formation of a step, on the surface of the semiconductor body.

According to an embodiment, the fixing layer is formed as a peripherally closed strip. In this case, the fixing layer is preferably formed as a strip-shaped adhesive layer or as a support layer with double-sided adhesive properties. In an alternative embodiment, the fixing layer is formed as a plastic film, particularly as a Kapton film, with an adhesive layer on the top and bottom side. Preferably, the thickness of the Kapton film is substantially as great as the thickness of the adhesive layer on the top and bottom side. The barrier is secured against slipping in further process steps by the fixing layer. Furthermore, a reliable sealing surface is formed between the bottom side of the barrier and the semiconductor surface during the formation of the semiconductor housing. Next, a plunger presses on the top area of the barrier and the semiconductor body is encapsulated with a plastic compound. The process of casting with the plastic compound is also called molding. Also, when using an elastic fixing layer the pressure forces of the plunger during the molding process can be taken up at least partially and damage of the underlying semiconductor surface reduced.

Tests have shown that particularly by means of the positioning on top of a prefabricated barrier, which is preferably designed as a frame, a frame can be produced much more reliably and cost-effectively. Lower frames in particular have a lower height tolerance. It is preferred hereby that the barrier, which can be produced by a photo lithographic process, has a height of at least 100 µm, most preferably a height of at least 250 µm, and in an example embodiment the height of the barrier has a maximum height of 1 mm, however, it is noted that this height can also be greater. Particularly in a subsequent molding process, a lower barrier is of considerable advantage, because the reproducibility of the pressure load of the plunger surface lying on the top area of the barrier is much higher. As a result, individual barriers are excessively stressed. It is noted that the barrier can also be formed meander-shaped, apart from circular and frame-shaped.

The size of the opening on the top side of the semiconductor body is determined by the clear width of the barrier, i.e., in the case of a ring-shaped form the inner diameter. It is preferred to form the frame-shaped barrier of a metal, which preferably contains copper. An advantage of the metal frame is the chemical and particularly high mechanical stability. As a result, the reliability is increased in the formation of the housing during the molding process.

In another embodiment, the barrier has a bar on at least one outer side. It is preferred in particular that the barrier has precisely four bars. It is preferred further that the bars are partially visible at the outer side of the semiconductor housing.

In particular, semiconductor housings with openings can be used for the production or integration of integrated sensors in semiconductor chips.

In this regard, the sensor element is arranged at the lower end of the opening on the surface of the semiconductor body or at least partially integrated into its surface. The electrical connection of the sensors is expediently carried out by means of traces. The semiconductor body, also called a chip, has on its top side metal surfaces, also called pads, for connecting the chip to pins by means of bond wires.

Tests by the applicant have shown that in a refinement the use of a cost-intensive film on the surface of the plunger tool is unnecessary. As a result, during the molding process the surface of the plunger is pressed directly on the top area of the barrier.

According to another embodiment, the top area of the barrier can be formed at least partially parallel to the surface of the semiconductor body. Preferably, at least one part of the top area of the barrier is closed form-fittingly at least by part of the surface of the plunger over the entire length of the barrier. As a result, during the molding process, a sealing surface forms between the top area of the barrier and the surface of the plunger. Further, it is advantageous if the cross section of the barrier has a substantially rectangular cross section. As a result, the barrier has a small dimension on the bottom side and can be positioned especially close to an integrated circuit. According to another embodiment, the barrier is formed completely closed peripherally on the surface of the semiconductor body.

In an embodiment, the outer sides of the barrier can be spaced from the edge of the semiconductor body. In this case, the size and distance are selected so that one or more sensors can be formed within the barrier and the bonding surfaces and circuit parts can be arranged in the area between the outer side of the barrier and the edge of the semiconductor body.

It is furthermore preferred to position the plunger on the top area so that the plastic compound is connected form-fittingly with the barrier, preferably along the entire side area of the barrier facing away from the opening. Further, it is advantageous, if the opening angle of the opening, i.e., the angle of the normals of the surface of the semiconductor body is greater than 0°, preferably 7° to 10°. As a result, the diameter or the clear width of the opening to the top side of the semiconductor housing is increased. This is advantageous particularly for the influx of light and/or inward diffusion of gas molecules for a sensor formed within the opening.

According to an embodiment, the plastic compound and top area form an offset, so that at least one part of the top area of the barrier is not covered by the plastic compound. The minimum size of the offset results from the minimum bearing surface of the plunger on the top area of the barrier.

In an embodiment, a plate is formed on the top area of the barrier, whereby the plate covers the opening on the top side of the semiconductor body. The plate can be formed preferably as a diffusion-open plate. To this end, it is preferable to form a thin Teflon layer. In an alternative embodiment, the plate is formed as an opaque plate. It is also preferable to form the barrier as a barrier structure. In this case, a plurality of barriers with several separate or also connected parts is formed to form an individual larger opening or a plurality of separate openings on the surface of the semiconductor body. In particular, in the formation of several different sensors on a single semiconductor body, as a result, the sensors can be covered with plates, which have physical properties matched to the sensor type. In an embodiment, in a process step the barrier can be fixed on the surface of the semiconductor body and in a subsequent process step the plate can be placed on the top area. In an alternative embodiment, the plate even before the fixation of the barrier on the semiconductor surface is connected to the top area of the barrier. The molding process occurs only after the plate lies on the top area. The components in the opening, particularly sensors, are protected reliably from soiling by means of the overlying plate during molding as well. It is noted that the sensor can be formed as an FET sensor, preferably as a gas sensor, having a semiconductor substrate and a suspended gate.

According to an embodiment, it is preferred to form a peripheral strip-shaped adhesive layer between the top area and the plate. The plate can be secured against sliding in further process steps with the adhesive layer, which is formed preferably as a strip-shaped adhesive layer or as a supporting layer with double-sided adhesive properties. Furthermore, a reliable sealing surface is produced between the top area of the barrier and the plate during the formation of the semiconductor housing. After this, the barrier with the overlying plate is applied to the surface of the semiconductor body before the molding process is carried out. In the subsequent molding process, a plunger by means of the given bearing strength presses preferably directly on the plate, and as a result on the underlying top area of the barrier. The semiconductor body is encapsulated with a plastic compound. Further, when using an elastic adhesive layer, the pressure forces of the plunger can be absorbed at least partially during the molding process and damage to the underlying semiconductor surface reduced.

It is understood that to achieve an opening free of molding compound, during the molding at least one part of the top area of the barrier or a part of the plate is closed form-fittingly by a part of the surface of the plunger.

According to an embodiment, the plate can project over the outer side of the barrier with a distance. With the projection, an especially reliable sealing for the space formed within the barrier is achieved. During the subsequent molding process, it is preferable that the edge region of the plate and the outer side of the barrier form a form-fitting connection with the plastic compound. An especially reliable sealing is achieved because the plastic compound with a projecting plate produces a form-fit area both on the bottom side and on the top side of the plate. It is preferred to make the projection small, i.e., to make the projection within the range of the thickness of the barrier or preferably to form the projection as smaller than ⅕, and most preferably smaller than 1/20 of the clear width of the opening.

Tests by the applicant have shown that it is especially advantageous to position the barriers not individually on the surface of a semiconductor body, but to fix the barriers connected in a grid structure, formed from a plurality of barriers connected by the bars, before the molding process on the surfaces of the semiconductor bodies. In this case, the size of the grid structure and the number of barriers are adapted to the number and size of the semiconductor bodies, which are preferably arranged on a likewise connected array of lead frames. An advantage is that now not every individual barrier needs to be adjusted to the surface, but after the adjustment of the grid structure to the lead frame array, the grid structure is applied in a subsequent process step to the array of semiconductor bodies. It is preferred to form the barriers and in particular the entire grid structure of a metal or a metallic composition. Preferably the barriers have a rectangular cross section, whereby the height of the barrier is greater than 1 mm. Heights of this type cannot be achieved with a photolithographic process within the semiconductor production process. It is noted that the term, height of the barrier, is understood to be the extension of the barrier in the direction of the normals of the surface of the semiconductor body. The large height in the case of a plate lying on the surface of the barrier creates a sufficient distance between the bottom side of the plate and the sensor region. It is preferred further to make the thickness of the bars smaller than the height of the barrier. As a result, the bars are spaced apart from the semiconductor surface despite the fact that the barrier is connected force-fittingly with the bottom side with the semiconductor surface. It is preferred, furthermore, to design the number of bars as 3 or a multiple of 3.

In an embodiment refinement, the plates can be arranged on the top areas of the barrier before the application of the grid structure to the semiconductor bodies. Only after this is the grid structure fixed on the semiconductor bodies. After the molding process, the bars between neighboring barriers are separated and dicing of the barriers is performed.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
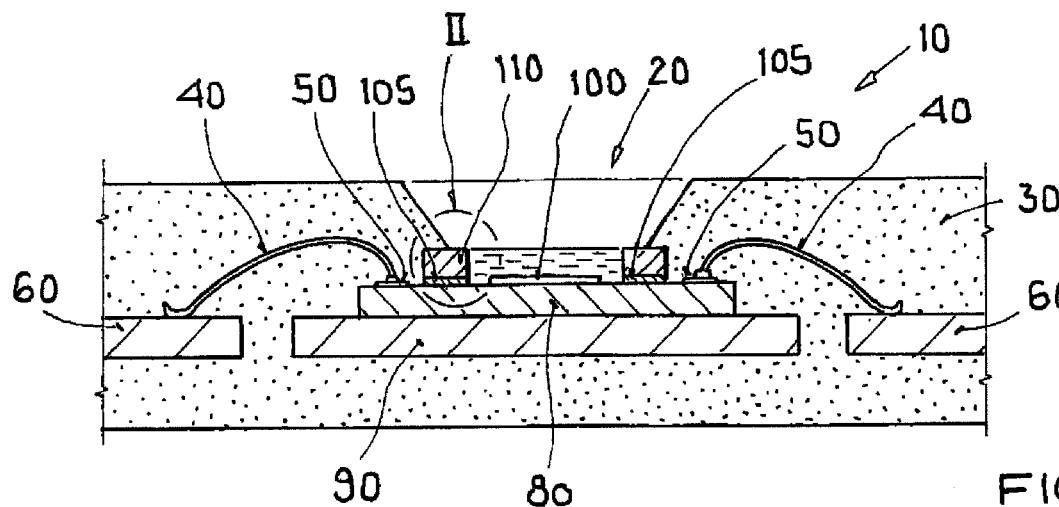
FIG. 1 shows a schematic cross section of an embodiment of a semiconductor housing.

The illustration in FIG. 1 shows an embodiment of a semiconductor housing 10 of the invention, with an opening 20, a plastic compound 30, which surrounds bond wires 40, connecting metal surfaces 50 electrically to pins 60. Further, plastic compound 30, which has a first plastic material, surrounds part of a surface of a semiconductor body 80. Semiconductor body 80 is arranged on a metal support 90 and connected force-fittingly to metal support 90. A schematically shown sensor 100 is arranged in opening 20. It is noted that the sensor can be formed as an FET sensor, preferably as a gas sensor, having a semiconductor substrate and a suspended gate. Plastic compound 30 begins in the area of the bottom side of opening 20 on a barrier 110 which is designed as a frame. The frame has a rectangular cross section. A fixing layer 105 is formed on the bottom side of the frame. In fact, the illustrated housing has a QFN housing form, but other housing forms with the frame design of the invention can be used for creating an opening.

Figure 2A:
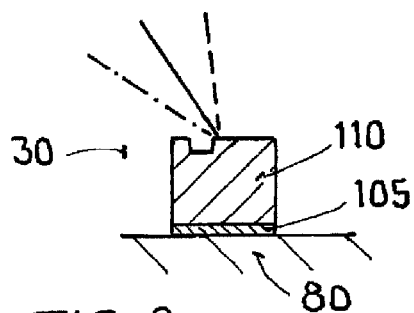
FIG. 2a shows an enlarged section of the barrier on the top side of the semiconductor body of FIG. 1 in a first embodiment.

In the illustration of FIG. 2a, a section of the transition between plastic compound 30 in the area of barrier 110 is shown enlarged as a cross section. Plastic compound 30 forms a different gradient angle with the top area of frame 110, depending on the reverse profile of the plunger during molding. Fixing layer 105 is formed on the bottom side of barrier 110 over the entire surface.

Figure 2B:
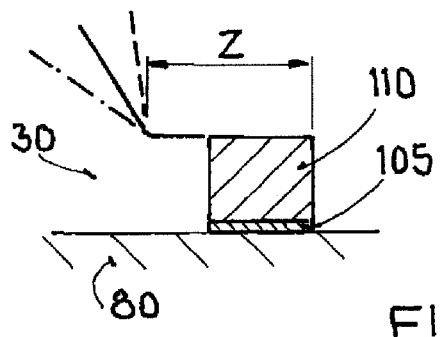
FIG. 2b shows an enlarged section of the barrier on the top side of the semiconductor body of FIG. 1 in a second embodiment.

In the illustration of FIG. 2b, a section of the transition between plastic compound 30 in the area of barrier 110 is also shown enlarged as a cross section. In contrast to the embodiment of FIG. 2a, the beginning of the molding compound shows an offset z to the inner edge of barrier 110; i.e., the plunger has a larger supporting surface on the top area of barrier 110 in comparison with FIG. 2a.

Figure 3:
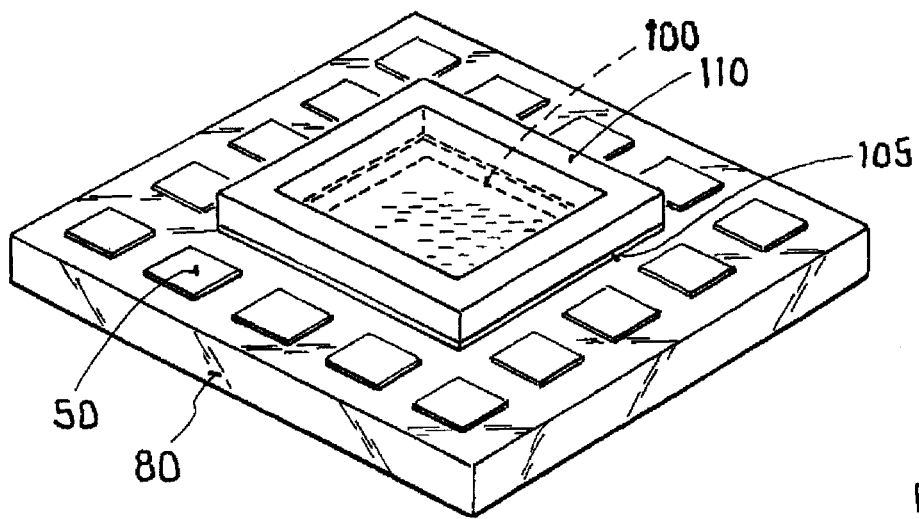
FIG. 3 shows a perspective view of a frame-shaped form of a barrier on the semiconductor surface in a non-molded state.

A perspective view of barrier 110 on semiconductor body 80 after completion of the adhesion process is shown in the illustration of FIG. 3. Barrier 110 has a frame-shaped form on the surface of semiconductor body 120. The positioning and size of the frame is determined especially by the size of the position of the sensor surface. Preferably, the barrier has a height above 1 mm and is electrically conductive and made of a metal or a metal composition.

Figure 4:
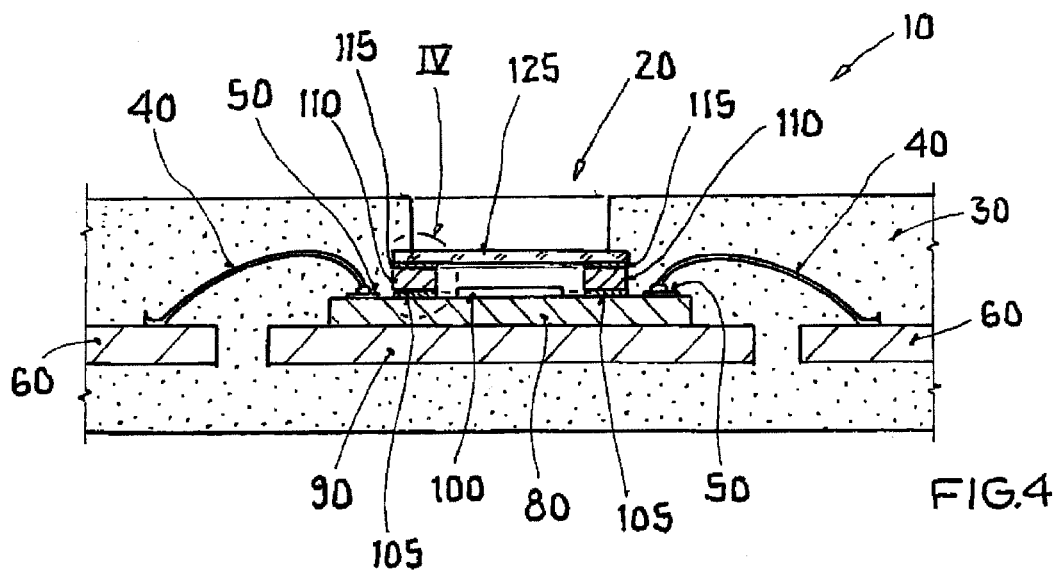
FIG. 4 shows a schematic cross section of an embodiment of a semiconductor housing with an overlying plate.

In the illustration of FIG. 4, an adhesive layer 115 is formed over the entire top area of barrier 110. A plate 125 is formed on adhesive layer 115. Plate 125 completely covers the area within barrier 110 and is spaced from the surface of the semiconductor body by the height of barrier 110 and the thickness of both layers 105, 115.

Figure 5A:
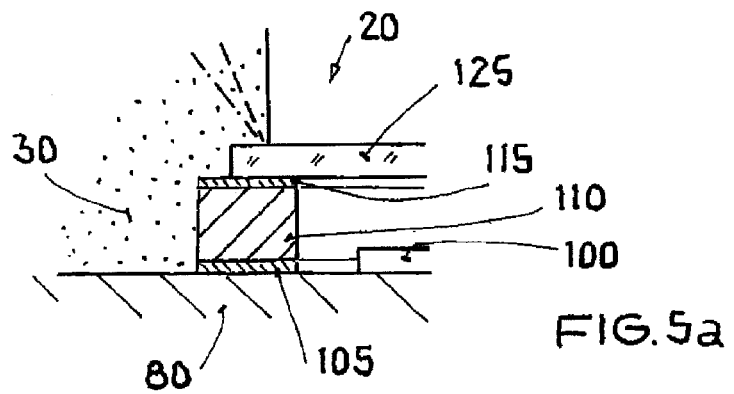
FIG. 5a shows an enlarged section of the barrier on the top side of the semiconductor body of FIG. 1 with an overlying plate which is set back from the outer edge of the barrier.

In the illustration of FIG. 5a, a section of the transition between plastic compound 30 in the area of barrier 110 is shown enlarged as a cross section. The top area of barrier 110 has adhesive layer 115 and the overlying plate 125, whereby the end of plate 125 is set back from the outer side of barrier 110. Plastic compound 30 forms a form-fitting connection with the top area of barrier 110 and the top side of plate 125 in the edge region thereof. Depending on the reverse profile of the plunger during molding, opening 20 forms different gradient angles.

Figure 5B:
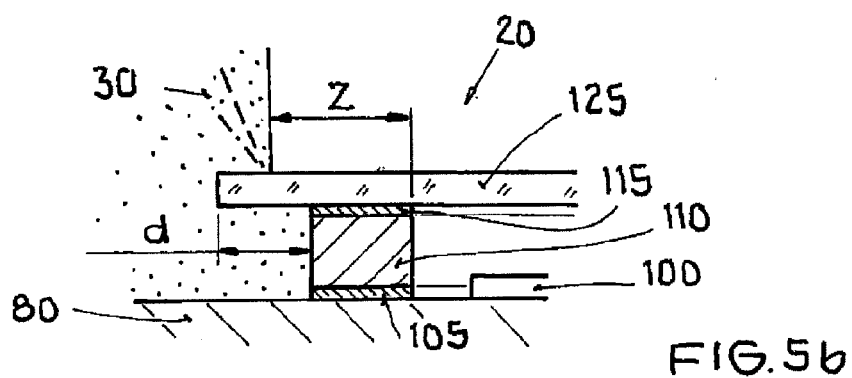
FIG. 5b shows an enlarged section of the barrier on the top side of the semiconductor body of FIG. 1 with an overlying plate which projects over the outer edge of the barrier.

In the illustration of FIG. 5b, a section of the transition between plastic compound 30 in the area of barrier 110 is also shown enlarged as a cross section. In this case, plate 125 projects by a distance d beyond the outer edge of barrier 110. In contrast to the embodiment of FIG. 5a, the beginning of the molding compound shows an offset z to the inner edge of barrier 110; i.e., the plunger has a larger supporting surface on the top area of barrier 110 in comparison with FIG. 5a. It is noted that in an alternative embodiment the offset z can also be formed much smaller than shown in FIG. 5b. In this case, molding compound covers plate 125 in such a way that a part of the molding compound is located above the top surface. Owing to the projection of plate 125, plastic compound 30 surrounds both on the top side and on the bottom side. As a result, an especially good sealing and/or fixation of the plate and particularly a force-fitting connection of the plate to the barrier and the semiconductor surface are achieved.

Figure 6:
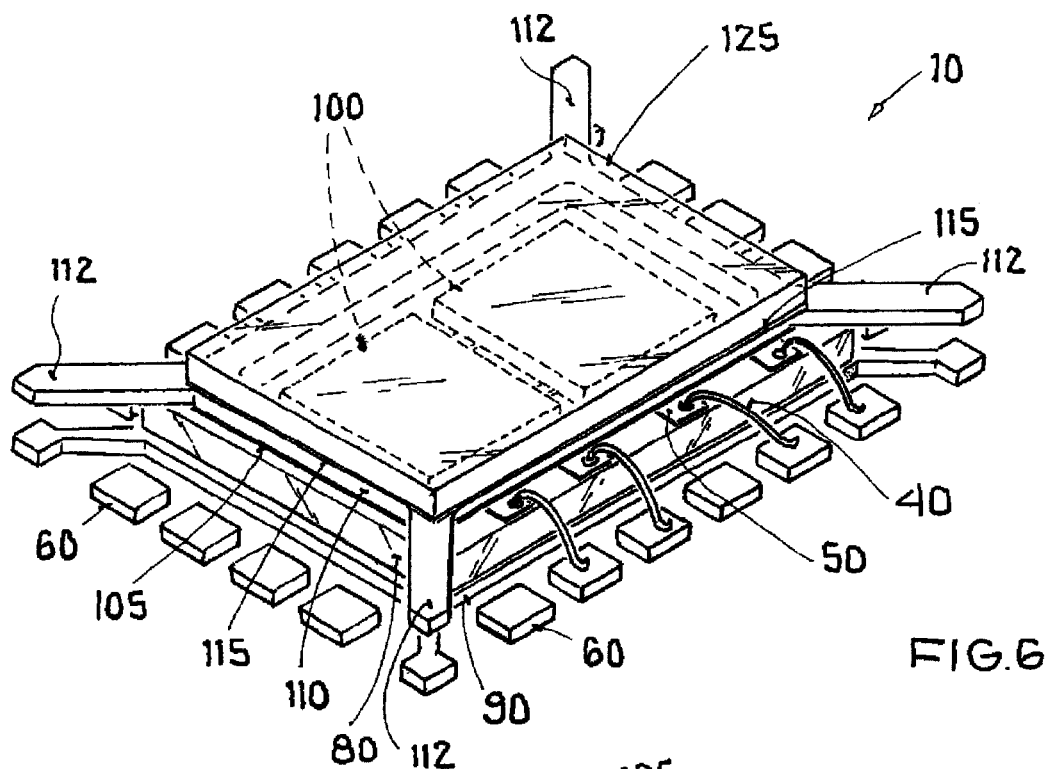
FIG. 6 shows a perspective view of a frame-shaped form of a barrier with an overlying plate in a non-molded state.

In the illustration of FIG. 6, a perspective view of barrier 110 with overlying plate 125 on semiconductor body 80 is shown after completion of the fixation and before the molding. Barrier 110 has a frame-shaped form on the surface of semiconductor body 120 and is completely covered by plate 125. Bars 112 are formed at all four corners of barrier 110. It is noted that no metal surfaces for bonding are formed below the bars. Bond wires 40 are not shown for the sake of clarity. Bars 112 form connections to one or more neighboring barriers (not shown) and are part of a grid structure (also not shown). The bars are enclosed by plastic compound 30 and separated in a dicing process carried out after the molding.

Figure 7:
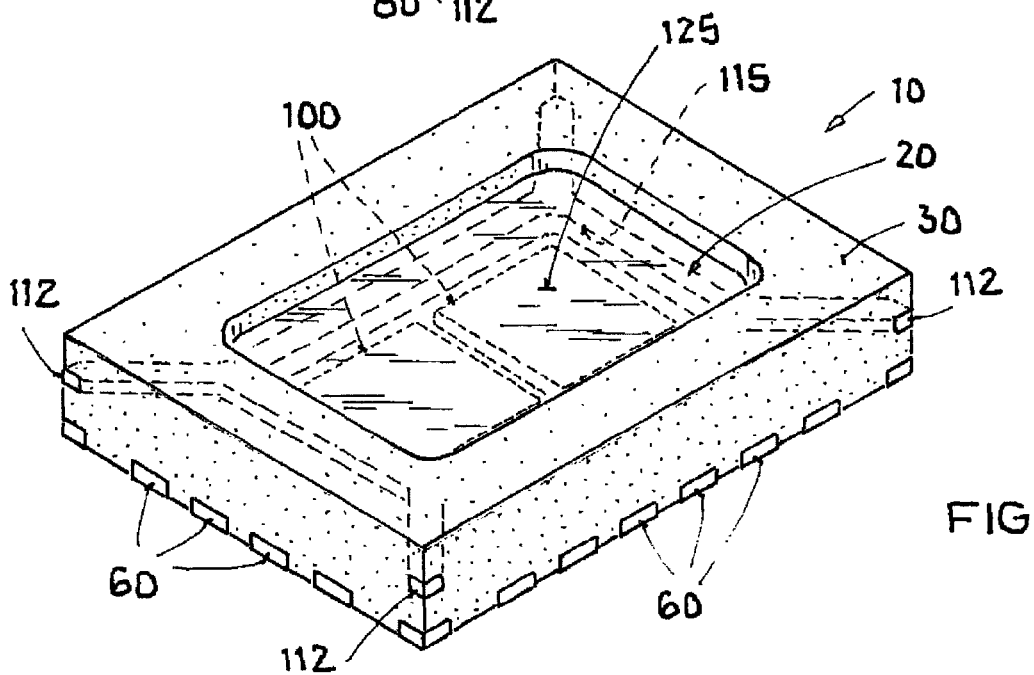
FIG. 7 shows a perspective view of the support of FIG. 6 in a molded state as a QFN housing.

In the illustration of FIG. 7, a semiconductor housing 10 designed as a QFN housing is shown after the dicing in a perspective view. The ends of the separated bars 112 are visible at the outer corners of semiconductor housing 10. The top side of plate 125 is visible in opening 20.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A semiconductor housing comprising:
   a metal support;
   a semiconductor body arranged on the metal support, the semiconductor body having a top side and a bottom side, the bottom side being configured to be connected force-fittingly to the metal support;
   a plurality of metal surfaces arranged on the top side of the semiconductor body, the metal surfaces being connectable to pins via bond wires for the electrical contacting of the semiconductor body;
   a plastic compound adapted such that the plastic compound completely surrounds the bond wires and partially surrounds the semiconductor body on the top side thereof and the pins, the plastic compound having an opening on the top side of the semiconductor body;
   a frame-shaped or ring-shaped barrier arranged on the top side of the semiconductor body, the barrier having a top area and a base area spaced from the edges of the semiconductor body, wherein an internal clearance of the barrier determines a size of the opening on the top side of the semiconductor body; and
   a plate formed on the top area of the barrier, the plate covering the opening on the top side of the semiconductor body, and an edge region of the plate and an outer side of the barrier forming a form-fitting connection with the plastic compound,
   wherein the plate is positioned such that it is set back from an outer edge of the barrier or projecting beyond the outer edge of the barrier,
   wherein, in a direction of a normal vector of an area on the top side of the semiconductor body, the plastic compound in an area outside the opening has a height greater than the barrier,
   wherein a fixing layer is formed between the base area of the barrier and the top side of the semiconductor body, and
   wherein the barrier is spaced from a sensor surface formed within the opening.

2. The semiconductor housing according to claim 1, wherein the fixing layer is formed as a peripherally closed strip.

3. The semiconductor housing according to claim 1, wherein the barrier has at least one bar extending respectively outward from at least one outer edge of the barrier.

4. The semiconductor housing according to claim 3, wherein the bar is partially visible at an outer side of the semiconductor housing.

5. The semiconductor housing according to claim 1, wherein the barrier is formed of metal and wherein the metal contains copper.

6. The semiconductor housing according to claim 1, wherein the barrier has a substantially rectangular cross section and a height of at least 100 µm.

7. The semiconductor housing according to claim 1, wherein the outer sides of the barrier are spaced from the edge of the semiconductor body.

8. The semiconductor housing according to claim 1, wherein the plastic compound and top area of the barrier form an offset so that at least one part of the top area of the barrier is not covered by the plastic compound.

9. The semiconductor housing according to claim 1, wherein a peripheral strip-shaped adhesive layer is formed between the top area of the barrier and the plate.

10. The semiconductor housing according to claim 1, wherein the plate projects over the outer side of the barrier with a distance.

11. The semiconductor housing according to claim 1, wherein the edge region of the plate and the outer side of the barrier has a form-fitting connection to the plastic compound.

12. The semiconductor housing according to claim 1, wherein an angle of the opening relative to the normal of the surface of the semiconductor body is greater than 0°.

13. The semiconductor housing according to claim 1 wherein an edge of the plastic compound contacts a top side of said plate at a gradient from a perpendicular extension of said top side of said plate.

14. A semiconductor housing comprising:
   a metal support;
   a semiconductor body arranged on the metal support, the semiconductor body having a top side and a bottom side, the bottom side being configured to be connected force-fittingly to the metal support;
   a plurality of metal surfaces arranged on the top side of the semiconductor body, the metal surfaces being connectable to pins via bond wires for the electrical contacting of the semiconductor body;
   a plastic compound adapted such that the plastic compound completely surrounds the bond wires and partially surrounds the semiconductor body on the top side thereof and the pins, the plastic compound having an opening on the top side of the semiconductor body;
   a frame-shaped or ring-shaped barrier arranged on the top side of the semiconductor body, the barrier having a top area and a base area spaced from the edges of the semiconductor body, wherein an internal clearance of the barrier determines a size of the opening on the top side of the semiconductor body; and
   a plate formed on the top area of the barrier, the plate covering the opening on the top side of the semiconductor body, and an edge region of the plate and an outer side of the barrier forming a form-fitting connection with the plastic compound,
   wherein, in a direction of a normal vector of an area on the top side of the semiconductor body, the plastic compound in an area outside the opening has a height greater than the barrier,
   wherein a fixing layer is formed between the base area of the barrier and the top side of the semiconductor body,
   wherein the barrier is spaced from a sensor surface formed within the opening,
   wherein a plurality of bars extend from the outer side of the barrier to an outer side of the plastic compound.

15. The semiconductor housing according to claim 14, wherein at least three bars extend from the outer side of the barrier to the outer side of the plastic compound.

16. The semiconductor housing according to claim 14, wherein the bars extend from each corner of the barrier.

17. The semiconductor housing according to claim 14, wherein a thickness of the bars is less than a height of the barrier.

18. The semiconductor housing according to claim 14, wherein the bars are spaced apart from the semiconductor surface.

19. The semiconductor housing according to claim 14, wherein an edge of the bars is flush with an edge of the plastic compound.

20. The semiconductor housing according to claim 14, wherein the bars, prior to a dicing and separation process, are joined with bars extending from barriers of adjacent semiconductor housings such that a grid structure is formed.

* * * * *